(12) United States Patent
Hanada et al.

(10) Patent No.: US 10,261,182 B2
(45) Date of Patent: Apr. 16, 2019

(54) OPTICAL SENSOR

(71) Applicant: Murata Manufacturing Co., Ltd., Nagaokakyo-shi, Kyoto-fu (JP)

(72) Inventors: Kaname Hanada, Nagaokakyo (JP); Shinichiro Chiku, Nagaokakyo (JP); Tsutomu Yamasaki, Nagaokakyo (JP); Tomiya Sonoda, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 169 days.

(21) Appl. No.: 14/678,072

(22) Filed: Apr. 3, 2015

(65) Prior Publication Data

US 2015/0212208 A1 Jul. 30, 2015

Related U.S. Application Data

(63) Continuation of application No. PCT/JP2013/075146, filed on Sep. 18, 2013.

(30) Foreign Application Priority Data

Oct. 5, 2012 (JP) ................................. 2012-223008

(51) Int. Cl.
*G01S 17/02* (2006.01)
*H01L 31/0203* (2014.01)
(Continued)

(52) U.S. Cl.
CPC .......... *G01S 17/026* (2013.01); *G01S 7/4813* (2013.01); *G01S 7/4814* (2013.01); *G01S 7/4816* (2013.01);
(Continued)

(58) Field of Classification Search
CPC .... G01S 17/026; G01S 7/4813; G01S 7/4814; G01S 7/4816; H01L 31/0203;
(Continued)

(56) References Cited

U.S. PATENT DOCUMENTS 4,346,293 A 8/1982 Fetzer
5,317,149 A * 5/1994 Uebbing ............ G01D 5/34715
250/216

(Continued)

FOREIGN PATENT DOCUMENTS

CN 101066194 A 10/2007
CN 102395859 A 3/2012

(Continued)

OTHER PUBLICATIONS

International Search Report for PCT/JP2013/075146, dated Oct. 15, 2013.

(Continued)

*Primary Examiner* — John R Lee
(74) *Attorney, Agent, or Firm* — Arent Fox LLP

(57) ABSTRACT

A light-emitting element and a light-receiving element are provided on a surface of a substrate. The light-emitting element and the light-receiving element are sealed by transparent resin members and, respectively. A lens is provided at the transparent resin member at a position above the light-emitting element. The center of the lens and a mounting position of the light-emitting element are disposed being shifted from each other. With this, an optical axis of light outputted via the lens is slanted toward an opposite direction side with respect to the light-receiving element at a predetermined elevation angle. In this case, a beam divergence angle of light outputted from the lens is set to a predetermined value.

15 Claims, 10 Drawing Sheets

(51) Int. Cl.
*H01L 31/0232* (2014.01)
*H01L 31/173* (2006.01)
*G01S 7/481* (2006.01)

(52) U.S. Cl.
CPC .... *H01L 31/0203* (2013.01); *H01L 31/02327* (2013.01); *H01L 31/173* (2013.01); *H01L 2924/1815* (2013.01); *Y02E 10/52* (2013.01)

(58) Field of Classification Search
CPC ............. H01L 31/02327; H01L 31/173; H01L 2924/1815; Y02E 10/52
See application file for complete search history.

(56) References Cited

U.S. PATENT DOCUMENTS

| | | | |
|---|---|---|---|
| 6,342,670 B1 * | 1/2002 | Lin | G08C 23/04 136/244 |
| 8,324,602 B2 | 12/2012 | Wiese et al. | |
| 2005/0087681 A1 | 4/2005 | Chin et al. | |
| 2007/0007612 A1 * | 1/2007 | Mills | B29C 45/401 257/433 |
| 2007/0241943 A1 | 10/2007 | Tan et al. | |
| 2008/0006762 A1 * | 1/2008 | Fadell | G01J 1/4204 250/201.1 |
| 2010/0155586 A1 | 6/2010 | Chin et al. | |
| 2010/0258710 A1 | 10/2010 | Wiese et al. | |
| 2010/0299642 A1 | 11/2010 | Merrell et al. | |
| 2012/0133956 A1 * | 5/2012 | Findlay | H01L 31/173 356/614 |
| 2013/0153772 A1 * | 6/2013 | Rossi | G01S 17/026 250/353 |
| 2013/0284908 A1 * | 10/2013 | Rossi | G01S 17/026 250/221 |
| 2015/0212208 A1 * | 7/2015 | Hanada | H01L 31/0203 250/221 |
| 2015/0241989 A1 * | 8/2015 | Heng | G06F 3/0304 250/221 |

FOREIGN PATENT DOCUMENTS

| | | |
|---|---|---|
| JP | S55-166073 A | 12/1980 |
| JP | S59-154083 A | 9/1984 |
| JP | 06-232446 A | 8/1994 |
| JP | 2002-168967 A | 6/2002 |
| JP | 2005037451 A | 2/2005 |
| JP | 2005-134391 A | 5/2005 |
| JP | 2011-060788 A | 3/2011 |
| JP | 2011-180121 A | 9/2011 |

OTHER PUBLICATIONS

Written Opiniion of the International Searching Authority for PCT/JP2013/075146, dated Oct. 15, 2013.

* cited by examiner

SHIFT AMOUNT X OF LIGHT-EMITTING ELEMENT FROM LENS CENTER [mm]

SHIFT AMOUNT X OF LIGHT-EMITTING ELEMENT FROM LENS CENTER [mm]

DISTANCE DIMENSION H BETWEEN COVER PLATE
AND SENSOR [mm]

DISTANCE DIMENSION H0 BETWEEN DETECTION TARGET OBJECT
AND SENSOR [mm]

DISTANCE DIMENSION H BETWEEN COVER PLATE AND SENSOR [mm]

DISTANCE DIMENSION H0 BETWEEN DETECTION TARGET OBJECT AND SENSOR [mm]

OPTICAL SENSOR

CROSS REFERENCE TO RELATED APPLICATIONS

The present application is a continuation of PCT/JP2013/075146 filed Sep. 18, 2013, which claims priority to Japanese Patent Application No. 2012-223008, filed Oct. 5, 2012, the entire contents of each of which are incorporated herein by reference.

FIELD OF THE INVENTION

The present invention relates to optical sensors configured to detect presence of detection target objects using light-emitting elements and light-receiving elements.

BACKGROUND OF THE INVENTION

In general, optical sensors configured to detect presence of detection target objects such as fingers, hands, and the like using light-emitting elements and light-receiving elements are known (for example, see Patent Document 1). The known optical sensor detects the presence of a detection target object in the following manner: that is, light is outputted from a light-emitting element and reflected by the detection target object, and the reflected light is then received by a light-receiving element, through which the presence of the detection target object is detected. Meanwhile in the optical sensor, in the case where light outputted from the light-emitting element enters the light-receiving element without striking the detection target object, such light can cause an erroneous detection.

In order to reduce influence of such stray light, in an optical sensor disclosed in Patent Document 1, lenses are provided above a light-emitting element and a light-receiving element, respectively, and an optical shield is disposed covering these lenses so that the light-emitting element and the light-receiving element are optically isolated from each other with an optical barrier of the optical shield.

Patent Document 1: Japanese Unexamined Patent Application Publication No. 2011-180121

The optical sensor disclosed in Patent Document 1 needs light shielding members such as an optical shield, an optical barrier, and the like in order to isolate a light-emitting element and a light-receiving element from each other, thereby increasing manufacturing costs. In addition, there arises a problem that using these members prevents the optical sensor from being miniaturized.

SUMMARY OF THE INVENTION

The present invention has been conceived in view of the above problems, and an object of the invention is to provide optical sensors capable of miniaturization while reducing stray light.

(1) In order to solve the aforementioned problems, an optical sensor of the present invention includes a substrate, a light-emitting element mounted on a surface of the substrate, a refractive-index medium provided above the light-emitting element, and a light-receiving element mounted on the surface of the substrate. The stated optical sensor detects presence of a detection target object by the light-receiving element receiving light which has been outputted from the light-emitting element and reflected by the detection target object. In the optical sensor, an optical axis of light outputted via the refractive-index medium is set at an elevation angle in a range of 47 degrees to 89 degrees toward an opposite direction side with respect to the light-receiving element, and a beam divergence angle of the light outputted via the refractive-index medium is set to be in a range of 1.8 degrees to 42 degrees.

According to the present invention, the optical axis of light outputted via the refractive-index medium is set at an elevation angle in a range of 47 degrees to 89 degrees toward the opposite direction side with respect to the light-receiving element, and the beam divergence angle is set to be in a range of 1.8 degrees to 42 degrees. As such, a stray light level can be lowered and a signal to noise ratio (S/N ratio) can be improved. Therefore, it is unnecessary to provide an optical barrier or the like, whereby the sensor can be miniaturized. In addition, also in the case where the upper side of the light-emitting element, the light-receiving element, and the like is covered with a light-transmissive cover, a variation of the stray light level can be made smaller at the positions in the upper-lower direction of the cover.

(2) In the present invention, the above-mentioned refractive-index medium is a lens, where an optical axis of light outputted via the stated lens is set at an elevation angle in a range of 50 degrees to 89 degrees toward the opposite direction side with respect to the light-receiving element, and a beam divergence angle of the light outputted via the lens is set to be in a range of 1.8 degrees to 20.3 degrees.

According to the present invention, the optical axis of light outputted via the lens is set at an elevation angle in a range of 50 degrees to 89 degrees toward the opposite direction side with respect to the light-receiving element, and the beam divergence angle is set to be in a range of 1.8 degrees to 20.3 degrees. This makes it possible to lower a stray light level. Further, since the light outputted from the light-emitting element is focused by the lens, the beam divergence angle can be made smaller, thereby making it possible to further reduce the influence of the stray light.

(3) In the present invention, a mounting position of the light-emitting element is shifted relative to the center of the lens in a direction coming closer to the light-receiving element to an extent in a range of 2% to 62% of the lens radius.

According to the present invention, the mounting position of the light-emitting element is shifted relative to the center of the lens in a direction coming closer to the light-receiving element to an extent in a range of 2% to 62% of the lens radius. As such, the optical axis of light outputted via the lens can be slanted toward the opposite direction side with respect to the light-receiving element.

(4) In the present invention, the aforementioned refractive-index medium is a slope member having a slope surface, where an optical axis of light outputted via the stated slope member is set at an elevation angle in a range of 47 degrees to 57 degrees toward the opposite direction side with respect to the light-receiving element, and a beam divergence angle of the light outputted via the slope member is set to be in a range of 29 degrees to 42 degrees.

According to the present invention, the optical axis of light outputted via the slope member is set at an elevation angle in a range of 47 degrees to 57 degrees toward the opposite direction side with respect to the light-receiving element, and the beam divergence angle is set to be in a range of 29 degrees to 42 degrees. This makes it possible to lower the stray light level.

(5) An optical sensor of the present invention includes a substrate, a light-emitting element mounted on a surface of the substrate, a refractive-index medium provided above the light-emitting element, and a plurality of light-receiving elements mounted on the surface of the substrate. The plurality of light-receiving elements are disposed at positions that do not sandwich the light-emitting element. The optical sensor detects presence of a detection target object by the light-receiving elements receiving light which has been outputted from the light-emitting element and reflected by the detection target object. In the optical sensor, an optical axis of light outputted via the refractive-index medium is set at an elevation angle in a range of 47 degrees to 89 degrees toward an opposite direction side with respect to the light-receiving elements, and a beam divergence angle of the light outputted via the refractive-index medium is set to be in a range of 1.8 degrees to 42 degrees.

According to the present invention, the optical axis of light outputted via the refractive-index medium is set at an elevation angle in a range of 47 degrees to 89 degrees toward the opposite direction side with respect to the light-receiving elements, and the beam divergence angle is set to be in a range of 1.8 degrees to 42 degrees. This makes it possible to lower the stray light level. In addition, since the plurality of light-receiving elements are provided, not only the presence of a detection target object but also a moving direction thereof can be detected at the same time.

DETAILED DESCRIPTION OF THE EXEMPLARY EMBODIMENTS

Hereinafter, optical sensors according to embodiments of the present invention will be described in detail with reference to the drawings.

Figure 1:
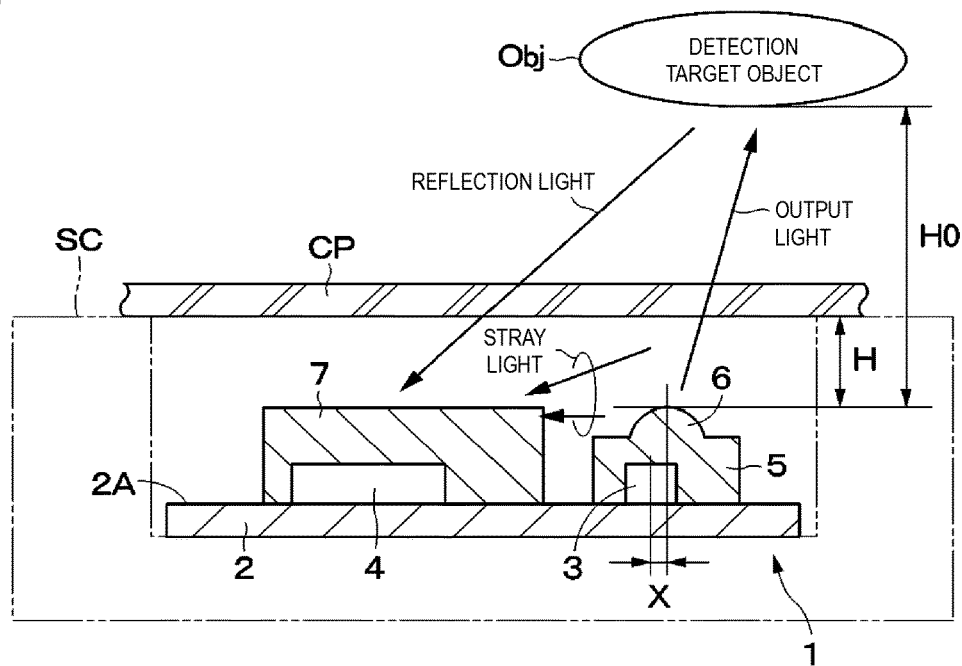
FIG. 1 is a cross-sectional view illustrating an optical sensor according to a first embodiment.
Figure 2:
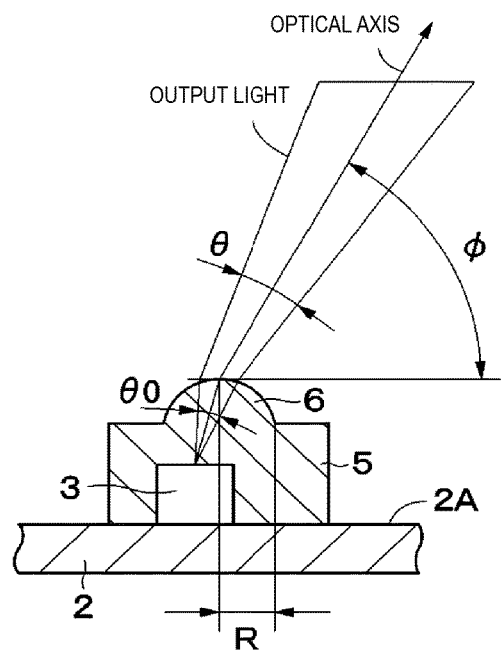
FIG. 2 is an enlarged cross-sectional view in which a light-emitting element and a lens shown in FIG. 1 are enlarged and illustrated.
Figure 3:
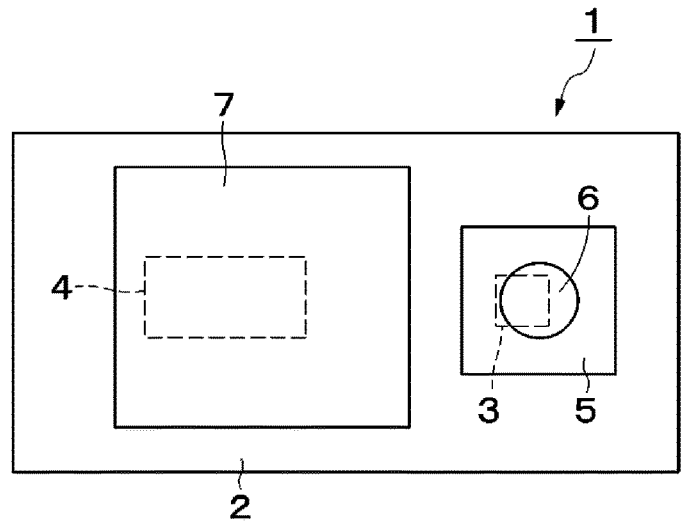
FIG. 3 is a plan view illustrating an optical sensor.

An optical sensor 1 according to a first embodiment is shown in FIGS. 1 through 3. The optical sensor 1 includes a substrate 2, a light-emitting element 3, a light-receiving element 4, a lens 6, and so on.

The substrate 2 is a plate formed of an insulating material. As the substrate 2, a printed circuit board is used, for example. On a surface 2A of the substrate 2, the light-emitting element 3 and the light-receiving element 4 are mounted.

The light-emitting element 3 is mounted on the surface 2A of the substrate 2, and outputs light such as infrared light, visible light, or the like. An optical axis of the light-emitting element 3 normally extends in a direction perpendicular to the surface 2A of the substrate 2 (Z axis direction), for example. As the light-emitting element 3, a light-emitting diode (LED), a laser diode (LD), or a vertical cavity surface emitting laser (VCSEL) is used, for example. In order to increase the resolution of detection and improve the S/N ratio, it is preferable to use a VCSEL, whose output angle (beam divergence angle) is intrinsically small, as the light-emitting element 3.

The light-receiving element 4 is mounted on the surface 2A of the substrate 2, and receives light such as infrared light, visible light, or the like. As the light-receiving element 4, a photodiode (PD), a phototransistor, or the like is used, for example. The light-receiving element 4 is disposed in the vicinity of the light-emitting element 3 while being distanced from the light-emitting element 3 in the left-right direction in FIG. 1, for example.

On the surface 2A of the substrate 2, a transparent resin member 5 is formed covering the light-emitting element 3. The transparent resin member 5 seals the light-emitting element 3. In the transparent resin member 5, the lens 6 as a refractive-index medium is formed being positioned above the light-emitting element 3 for use as the light-emitting element. The lens 6 is formed, for example, in a substantially hemispherical shape projecting upwardly.

The center of the lens 6 and a mounting position of the light-emitting element 3 are arranged as being shifted from each other. More specifically, the center of the lens 6 is disposed at a position more distanced from the light receiving element 4 than the mounting position of the light-emitting element 3 by a shift amount X. This causes the lens 6 to refract light from the light-emitting element 3 and slant an optical axis of the beams of light from the light-emitting element 3 from the vertical direction perpendicular to the substrate 2. In this case, the optical axis of light outputted via the lens 6 is slanted at an elevation angle φ toward an opposite direction side with respect to the light-receiving element 4.

Although the lens 6 is formed integrally with the transparent resin member 5 sealing the light-emitting element 3, the lens 6 may be provided being separated from the transparent resin member 5. Further, the configuration may be such that the transparent resin member 5 is omitted. In this case, the configuration may be such that the lens 6 is supported by a supporting member independently provided on the substrate 2, for example.

On the surface 2A of the substrate 2, a transparent resin member 7 is formed covering the light-receiving element 4. The transparent resin member 7 seals the light-receiving element 4. In the transparent resin member 7, a lens may be formed at a position above the light-receiving element 4 for use as the light-receiving element and the lens may focus the light entering from the exterior on the light-receiving element 4.

Although an example in which the light-emitting element 3 and the light-receiving element 4 are sealed by the different transparent resin members 5 and 7, respectively, is given before, these transparent resin members 5 and 7 may be integrated into one unit and seal the light-emitting element 3 and the light-receiving element 4 together.

The optical sensor 1 configured as described above is used, for example, in a state where it is housed in a sensor casing SC and the upper portion thereof is covered by a cover plate CP that is formed of transparent glass, a transparent resin material, or the like. In this case, light outputted from the light-emitting element 3 (output light) passes through the cover plate CP and strikes a detection target object Obj such as a hand, a finger, or the like. Further, light reflected by the detection target object Obj (reflection light) passes through the cover plate CP and is received by the light-receiving element 4. Through this, the optical sensor 1 can detect whether or not the detection target object Obj is present at a position above the optical sensor 1, in other words, can detect presence of the detection target object Obj.

Here, part of output light from the light-emitting element 3 is reflected or scattered by a reflective member such as the cover plate CP and returns to the light-receiving element 4 in some case. In addition, a direct wave, which is the light that is outputted from the light-emitting element 3 and directly propagates in the interior of the transparent resin members 5 and 7 to enter the light-receiving element 4, is generated in some case. Here, a generic name of "stray light" is given to various types of light that enter the light-receiving element 4, such as reflection light from the cover plate CP, scattering light from the cover plate CP, and light which propagates in the transparent resin member 5, 7 and the like.

Figure 4:
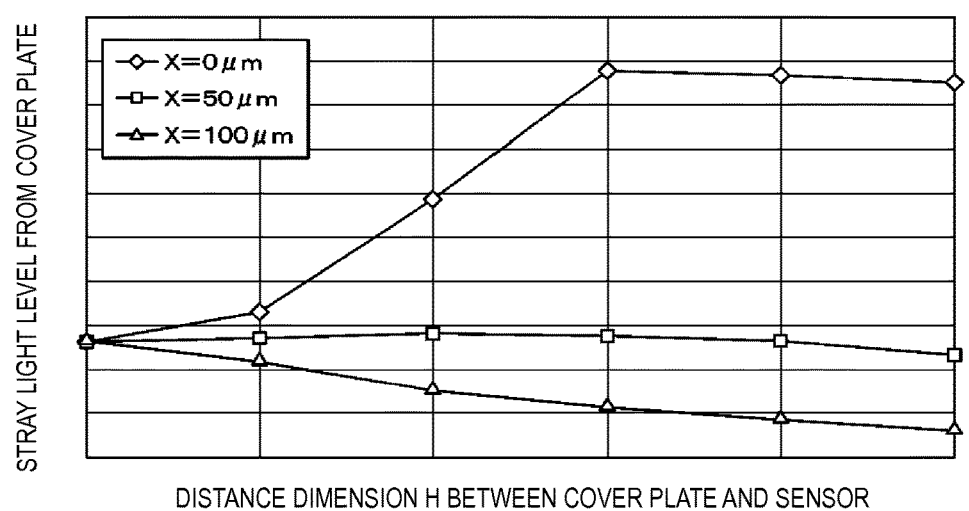
FIG. 4 is a characteristics diagram indicating a relationship between a stray light level from a cover plate and a distance dimension between the cover plate and a sensor, based on measurement data.

As shown in FIG. 4, the inventors of the present invention have confirmed through an experiment that a light intensity level of stray light SL (hereinafter, called a stray light level) increases in accordance with the height in position of the cover plate CP when the light-emitting element 3 is disposed at a position where the shift amount X is 0 (X=0) with respect to the center of the lens 6. In other words, in the case where the light-emitting element 3 is disposed and mounted just immediately under the center of the lens 6 and the light emitted from the light-emitting element 3 is outputted in the vertical direction, an amount of light that is reflected by the cover plate CP at least increases, that is, stray light increases so that a detection characteristic of the optical sensor 1 is degraded.

On the other hand, in the case where the light-emitting element 3 is shifted toward a light-receiving element 4 side relative to the center of the lens 6 so that the shift amount X is larger than 0 (X>0), the stray light level becomes constant or decreases even if the height in position of the cover plate CP changes. In other words, stray light is reduced by slanting the light emitted from the light-emitting element 3 toward an opposite direction side with respect to the light-receiving element 4 or slanting the light outputted from the lens 6 toward the opposite direction side with respect to the light-receiving element 4.

The reason for this can be considered as follows: that is, in the case where the mounting position of the light-emitting element 3 is shifted toward the light-receiving element 4 side relative to the center of the lens 6, the optical axis of light outputted from the lens 6 is slanted toward the opposite side with respect to the light-receiving element 4, whereby an amount of light that is reflected by the cover plate CP and returns to the light-receiving element 4, that is, a stray light level is lowered due to the slant of the optical axis. Here, the light-emitting element 3 used in the above experiment was a vertical cavity surface emitting laser configured to output infrared light in an 850 nm band. The wave length of light outputted by the light-emitting element 3 is not limited to the 850 nm band, and can be appropriately changed depending on design specifications or the like.

Figure 5:
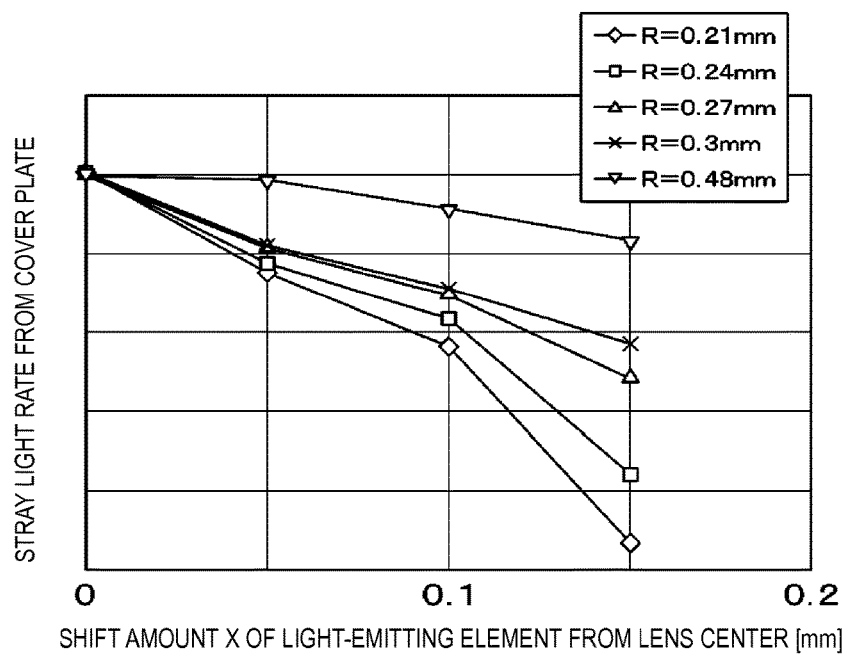
FIG. 5 is a characteristics diagram indicating a relationship between a shift amount of a light-emitting element from the center of a lens and a stray light level from a cover plate, based on simulation.

In order to verify the measurement data in FIG. 4, the shift amount X and a stray light rate from the cover plate CP were calculated using an optical simulator. The calculation result is shown in FIG. 5. The lens 6 used in the measurement and the simulation is a spherical lens unless otherwise specified. The stray light rate from the cover plate CP is, in the case where a stray light level when the shift amount X is 0 is taken as the reference stray light level, a rate of a stray light level with respect to the reference stray light level.

The calculations in the simulation were carried out using a lens radius R as a parameter. The lens radius R represents a radius dimension of the lens 6 in the case where a projection dimension of the lens 6 from the transparent resin member 5 is set to a certain set value such as 0.15 mm, for example. In other words, a spherical lens with a larger lens radius R is a spherical lens having a larger curvature radius.

As shown in FIG. 5, the stray light rate from the cover plate CP can be reduced by largely shifting the light-emitting element 3 toward the light-receiving element 4 side relative to the center of the lens 6, in other words, by increasing the shift amount X. Based on the result shown in FIG. 5, an effect upon lowering the stray light level is increased as the lens radius R is made smaller, but the slant of the stray light rate becomes steeper with respect to the shift amount X of the light-emitting element 3. As such, sensitivity due to variations of the mounting positions of the light-emitting element 3, the lens 6, and the like is increased. Accordingly, from a manufacturing standpoint, it is important to select such lens radius R that can alleviate the mounting tolerance within a permissible range of the stray light level and can be manufactured with ease.

Figure 6:
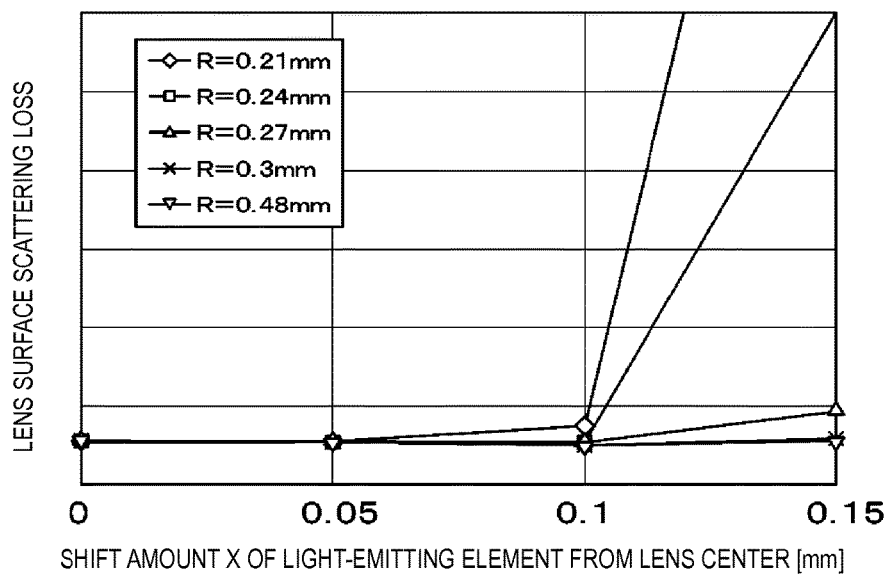
FIG. 6 is a characteristics diagram indicating a relationship between a shift amount of a light-emitting element from the center of a lens and lens surface scattering loss.

FIG. 6 indicates a relationship between the shift amount X of the light-emitting element 3 and lens surface scattering loss, using the lens radius R as a parameter. As can be understood from FIG. 6, as the lens radius R is made smaller, the lens surface scattering loss becomes larger so that light is not outputted from the lens 6 from a certain mounting position. For example, in the case of the lens radius R being 0.21 mm, the lens surface scattering loss sharply increases when the shift amount X of the light-emitting element 3 is equal to or greater than 100 μm; that is, although the stray light level is seemingly lowered, signals cannot be obtained, in other words, a preferable S/N ratio cannot be obtained.

Further, a relationship between the lens radius R and a beam divergence angle θ was calculated using an optical simulator. The result thereof is shown in Table 1. Note that the beam divergence angle θ corresponds to the full width at half maximum of the light outputted from the lens 6. Further, the beam divergence angle θ shown in Table 1 represents values when the shift amount X of the light-emitting element 3 relative to the center of the lens 6 was assumed to be 0. As shown in Table 1, as the lens radius R is larger, the beam divergence angle θ is larger as well.

TABLE 1

| | Lens Radius R [mm] | | | | | | |
|---|---|---|---|---|---|---|---|
| | 0.21 | 0.24 | 0.27 | 0.34 | 0.37 | 0.4 | 0.48 |
| Beam Divergence Angle θ [deg] | 13.5 | 14.9 | 16.4 | 18.5 | 18.7 | 19.3 | 20.3 |

TABLE 2

| Lens Radius R [mm] | Shift Amount X of Light-emitting Element [μm] | Beam Divergence Angle θ [deg] |
|---|---|---|
| 0.21 | 130 | 1.8 |
| 0.48 | 20 | 20.3 |

Here, as the light-emitting element 3 is shifted from the center of the lens 6, the beam divergence angle θ tends to be narrower, but a magnitude correlation of the beam divergence angle θ with respect to the lens radius R is the same as that in the case of the shift amount X being 0. As shown in Table 2, in the case of the lens radius R being 0.21 mm to 0.48 mm, the smallest beam divergence angle θ is obtained when the lens radius R is 0.21 mm and the shift amount X of the light-emitting element 3 is 130 μm. At this time, the beam divergence angle θ is 1.8 degrees. Meanwhile, the largest beam divergence angle θ is obtained when the lens radius R is 0.48 mm and the shift amount X of the light-emitting element 3 is 20 μm. At this time, the beam divergence angle θ is 20.3 degrees. Accordingly, in order to make the stray light level equal to or lower than a set value with respect to the height in position of the cover plate CP, the beam divergence angle θ of the light outputted from the lens 6 which serves as a refractive-index medium must be at least in a range of 1.8 degrees to 20.3 degrees.

Figure 7:
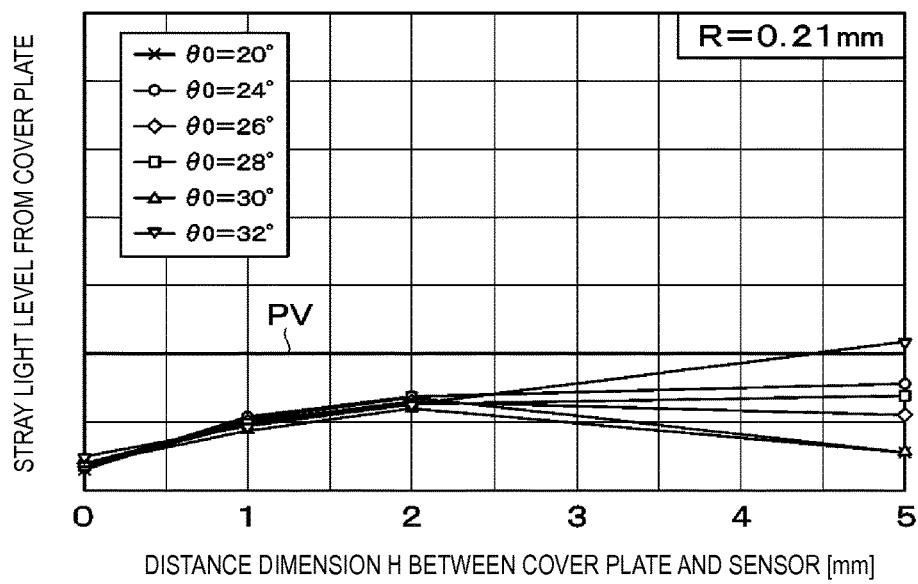
FIG. 7 is a characteristics diagram indicating a relationship, based on simulation, between a stray light level from a cover plate and a distance dimension between the cover plate and a sensor, in the case where the lens radius R is set to 0.21 mm.
Figure 8:
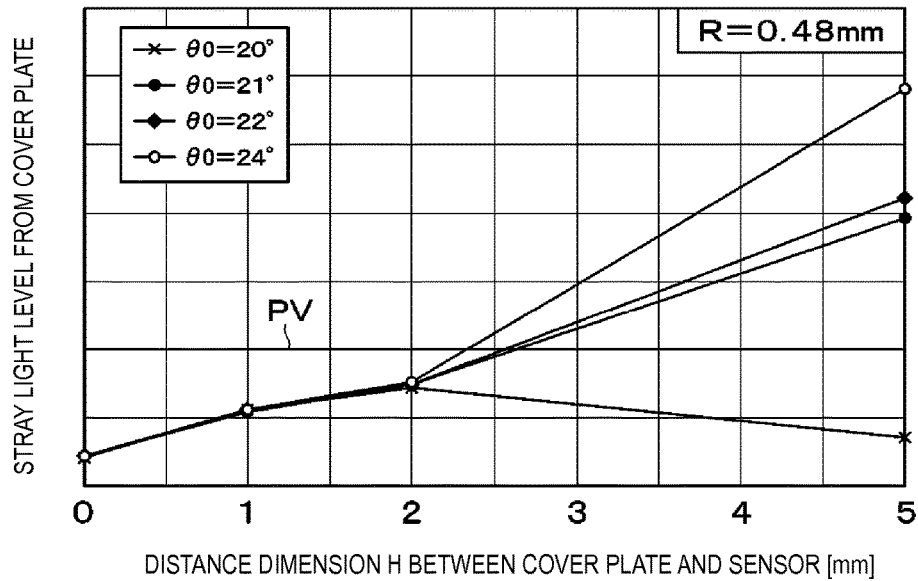
FIG. 8 is a characteristics diagram indicating a relationship, based on simulation, between a stray light level from a cover plate and a distance dimension between the cover plate and a sensor, in the case where the lens radius R is set to 0.48 mm.

Furthermore, a relationship between the height in position of the cover plate CP (distance dimension H) and the stray light level was calculated using an optical simulator in the cases where the lens radius R was 0.21 mm and 0.48 mm, respectively, using the beam divergence angle A0 of the light-emitting element 3 itself as a parameter. The results are shown in FIG. 7 and FIG. 8, respectively. The distance dimension H, as the height in position of the cover plate CP, between the cover plate CP and the optical sensor 1 specifically represents a distance dimension in the height direction between the cover plate CP and the lens 6. Note that the light-emitting element 3 was set at a position shifted toward the light-receiving element 4 side by 50 μm relative to the center of the lens 6 (X=50 μm). Based on the calculation results, in the case where the stray light level is defined to be equal to or lower than a certain permissible value PV, the beam divergence angle θ0 must be equal to or less than 30 degrees when the lens radius R is 0.21 mm and must be equal to or less than 20 degrees when the lens radius R is 0.48 mm. In this case, as the permissible value PV, a value approximately two to six times, preferably approximately three to five times the stray light level when the distance dimension H is 0 μm can be considered, for example. It was assumed that the far field pattern (FFP) of the light-emitting element 3 was a Gaussian pattern.

From the above result, it is understood that the beam divergence angle θ0 must be set equal to or less than a certain set value with the lens radius R so as to restrict the stray light level to be equal to or lower than a certain set level with respect to the height in position of the cover plate CP.

In Table 1, actually measured data of the FFP of a vertical cavity surface emitting laser was set for the light-emitting element 3 and the full width at half maximum of the beam (divergence angle θ0) was defined to be approximately 20 degrees. As such, it is also indicated by the above calculation result that the stray light level can be restricted to be equal to or lower than a specified value with the lens radius R being in a range of 0.21 mm to 0.48 mm. Qualitatively speaking, because the divergence angle θ0 of light outputted from the lens 6 further expands as the lens radius R is larger, it is considered that the beam divergence angle θ0 of the original light-emitting element 3 itself must be narrowed to some extent so as to restrict the stray light level to be equal to or lower than a certain set value.

In addition, the elevation angle φ of a beam optical axis with respect to the shift amount X of the light-emitting element 3 was calculated using an optical simulator. The result thereof is shown in Table 3. A distance by which the light-emitting element 3 can be shifted from the center of the lens 6 is restricted by the lens 6. In Table 3, portions where no numeric value is written each correspond to a region where the lens surface scattering loss is so large that the amount of light outputted from the lens 6 is significantly decreased. On the other hand, the regions where the lens surface scattering loss is so small that a sufficient amount of light is outputted from the lens 6 are, for example, a region in a range of 20 μm to 130 μm (9.5% to 62% of the lens radius R) when the lens radius R is 0.21 mm and a region in a range of 20 μm to 290 μm (4.2% to 60.4% of the lens radius R) when the lens radius R is 0.48 mm.

A lower limit of the shift amount X is determined by, for example, an attachment error or the like of the light-emitting element 3, sensitivities of the elevation angle φ and the divergence angle θ influenced by the above error, and the like. As such, the lower limit of the shift amount X takes a value of approximately 10 μm to 30 μm. Meanwhile, as shown in Table. 3, an upper limit of the shift amount X is determined by a range where a sufficient amount of light is outputted from the lens 6, and it takes a value of approximated 60% to 62% of the lens radius R, for example.

TABLE 3

| Shift Amount X of Light-emitting Element [μm] | Lens Radius R [mm] | | | | | | |
|---|---|---|---|---|---|---|---|
| | 0.21 | 0.24 | 0.27 | 0.34 | 0.37 | 0.4 | 0.48 |
| 20 | 87° | 88° | 88° | 89° | 89° | 89° | 89° |
| 50 | 82° | 83° | 84° | 85° | 86° | 87° | 87° |
| 100 | 70° | 74° | 77° | 80° | 81° | 82° | 84° |
| 130 | 55° | 65° | 70° | 76° | 78° | 79° | 81° |
| 150 | — | 53° | 63° | 72° | 74° | 77° | 80° |
| 170 | — | — | 53° | 68° | 71° | 75° | 77° |
| 200 | — | — | — | 59° | 66° | 69° | 73° |
| 210 | — | — | — | 55° | 63° | 67° | 73° |
| 230 | — | — | — | — | 53° | 62° | 70° |
| 250 | — | — | — | — | — | 50° | 67° |
| 290 | — | — | — | — | — | — | 51° |

Although the mounting position tolerance of the light-emitting element 3 can be alleviated by making the lens radius R larger, the stray light level becomes larger as shown in FIG. 5. It is necessary to select the lens radius R in accordance with the required characteristics of the optical sensor 1. As shown in FIG. 3, in a range of the lens radius R being 0.21 mm to 0.48 mm, the optical axis of light outputted from the lens 6 is 51 degrees to 89 degrees in elevation angle ϕ.

Figure 9:
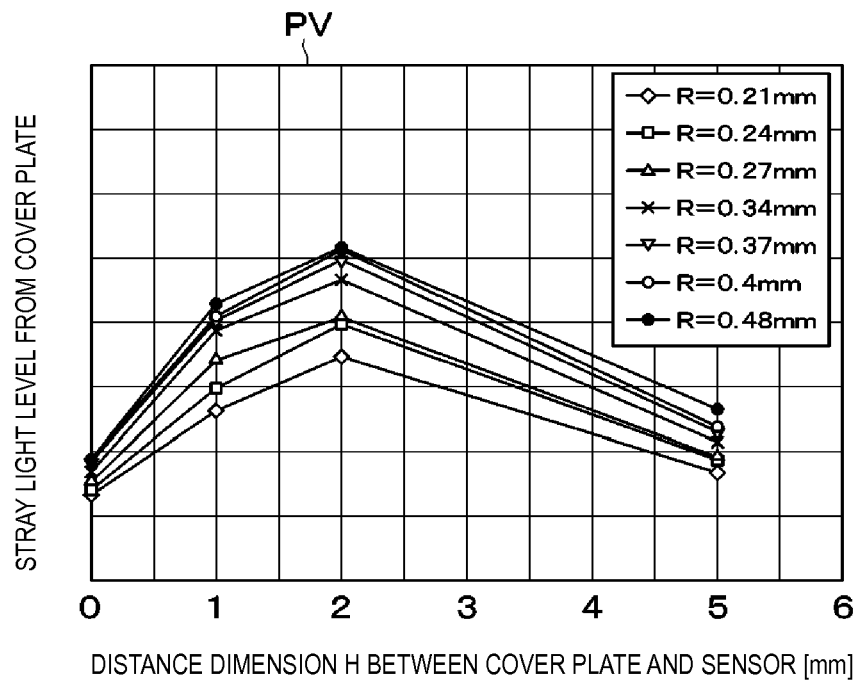
FIG. 9 is a characteristics diagram indicating a relationship between a stray light level from a cover plate and a distance dimension between the cover plate and a sensor, based on simulation.
Figure 10:
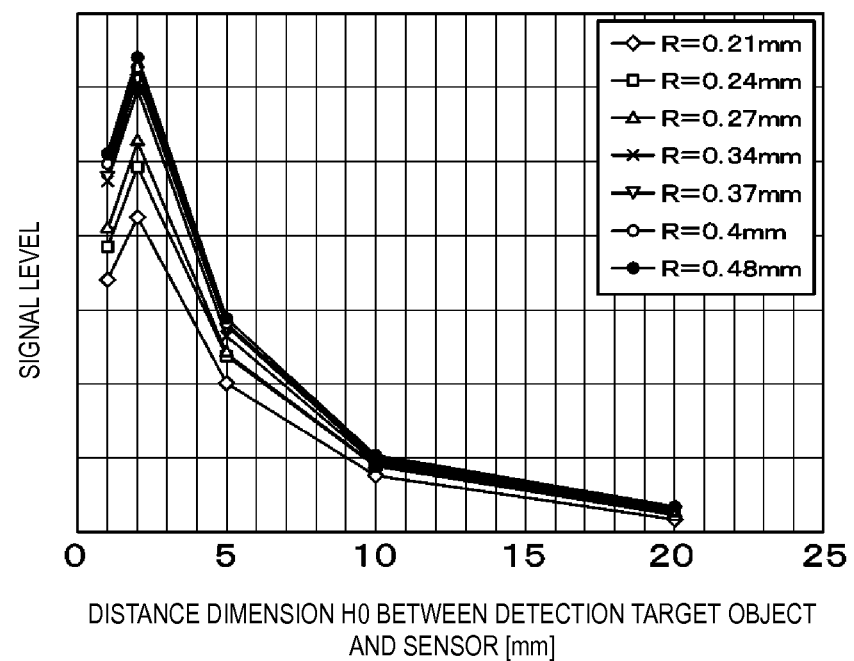
FIG. 10 is a characteristics diagram indicating a relationship between a signal level and a distance dimension between a detection target object and a sensor, based on simulation.

Simulations of the stray light level and signal level were carried out using the lens radius R as a parameter. The results are shown in FIG. 9 and FIG. 10, respectively. FIG. 9 indicates a relationship between the stray light level from the cover plate and the distance dimension H between the cover plate CP and the sensor, while FIG. 10 indicates a relationship between the signal level and the distance dimension H0 between the detection target object Obj and the sensor. In each case, the shift amount X of the light-emitting element 3 toward the light-receiving element 4 side relative to the center of the lens 6 is 100 μm. As shown in FIG. 9, the stray light level is smaller as the lens radius R is smaller; however, as shown in FIG. 10, the signal level is lowered. The reason for this can be considered as follows: that is, the beam divergence angle θ of light outputted from the lens 6 becomes narrower as the lens radius R is smaller, so that the elevation angle ϕ of the optical axis becomes smaller, in other word, the slant thereof becomes larger.

Qualitatively speaking, as light outputted from the lens 6 travels being distanced farther from the light-receiving element 4 and the beam divergence angle θ becomes smaller, light that is reflected by and returns from the cover plate CP (stray light) becomes smaller in quantity accordingly. Meanwhile, regarding the signal level, although the light outputted from the lens 6 travels being distanced farther from the light-receiving element 4, light that returns (signal) is increased in quantity because the beams of light is focused.

Since the characteristics of the optical sensor 1 are finally determined by the S/N ratio on which detection performance thereof depends, an optimum structure must be determined by the lens radius R and the mounting position of the light-emitting element 3.

Figure 11:
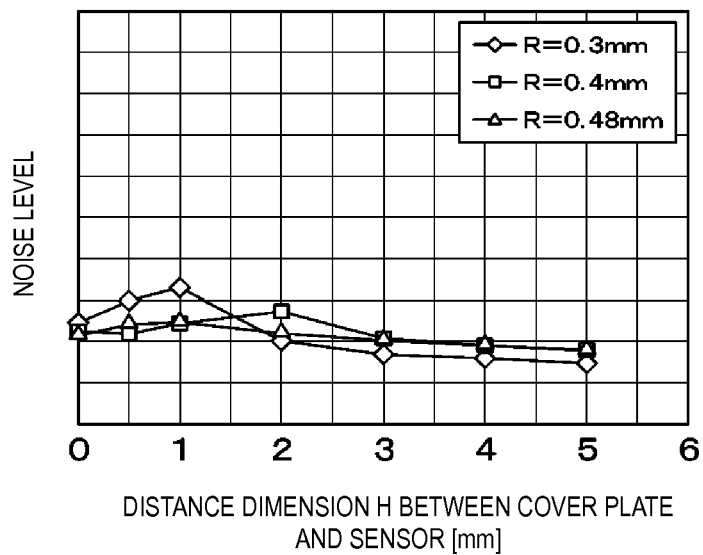
FIG. 11 is a characteristics diagram indicating a relationship between a noise level and a distance dimension between a cover plate and a sensor, based on measurement data.

FIG. 11 illustrates measurement data of a noise level. Also in the measurement data, the noise level is substantially constant with respect to the position of the cover plate CP (glass plate). Although a magnitude correlation of the noise level is partly inconsistent in a range of 0 to 3 mm of the distance dimension H (height position) of the cover plate CP in the height direction, the noise level is smaller as the lens radius R is smaller, like the simulation result, in a range of 3.5 to 5 mm of the distance dimension H of the cover plate CP. The reason why the term "noise level" is used in the measurement data is such that noise other than stray light (for example, noise that depends on the light-receiving element 4 itself or the like) is expected to be included therein. Note that, however, noise can possibly have a high proportion of the stray light.

Figure 12:
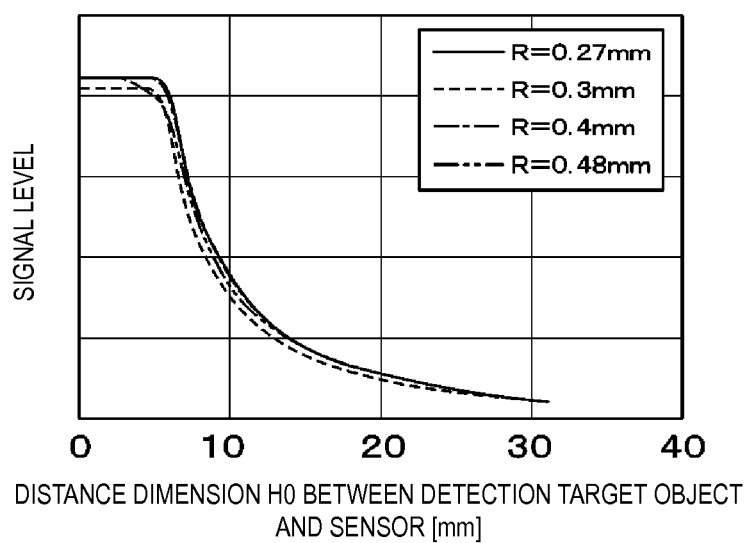
FIG. 12 is a characteristics diagram indicating a relationship between a signal level and a distance dimension between a detection target object and a sensor, based on measurement data.

FIG. 12 shows measurement data of the signal level. In a range of 0 to 6 mm of the distance dimension H0 (height position) of the detection target object Obj, the signal level is saturated because intensity of the signal that is reflected from the detection target object Obj and inputted to the light-receiving element 4 is strong; however, in a range of no less than 6 mm of the distance dimension H0 of the detection target object Obj, the signal level exhibits a similar trend to that in the simulation result as shown in FIG. 10. As for the magnitude correlation of the signal level, a trend thereof substantially matches the simulation result except for the case in which the lens radius R is 0.48 mm.

As discussed thus far, in the case where the lens 6 is used for the refractive-index medium, it has been confirmed through experiment and simulation that stray light from the cover plate CP can be made substantially constant irrespective of the position of the cover plate CP by slanting the optical axis of light outputted from the lens 6 toward the opposite side with respect to the light-receiving element 4. For example, in the case where the lens radius R is in a range of 0.21 mm to 0.48 mm, by setting the optical axis of light outputted via the lens 6 with the elevation angle ϕ in a range of 50 degrees to 89 degrees toward the opposite direction side with respect to the light-receiving element 4 and setting the beam divergence angle θ to be in a range of 1.8 degrees to 20.3 degrees, the stray light level can be lowered while the signal level being ensured.

In the first embodiment, although the description is given based on an example in which the lens 6 is a spherical lens, the lens 6 may be, for example, an aspherical lens or an asymmetric lens having different curvature in the front-rear direction and the left-right direction.

Figure 13:
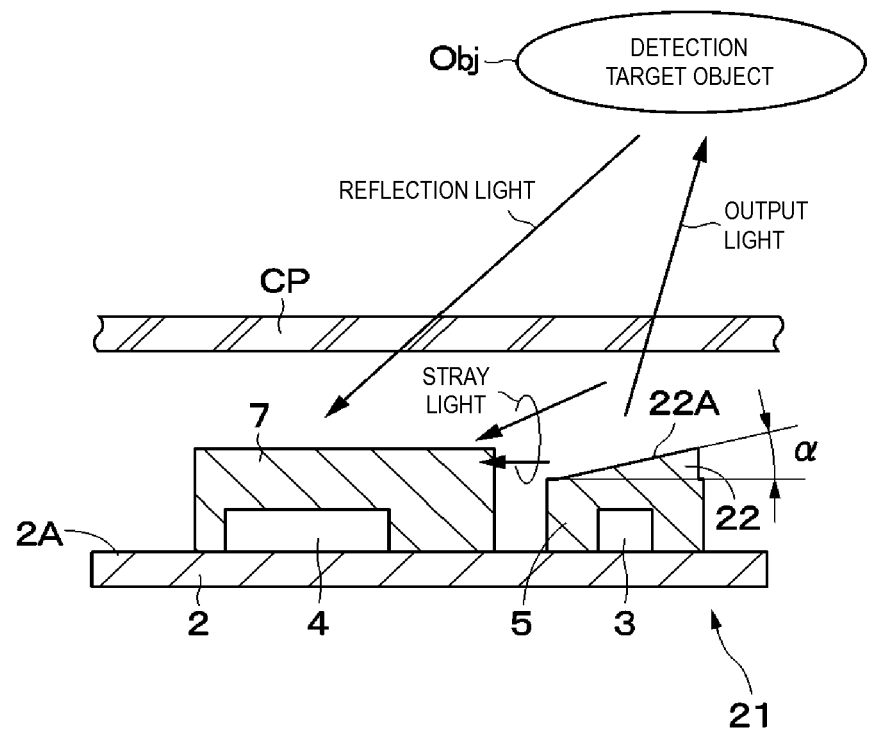
FIG. 13 is a cross-sectional view illustrating an optical sensor according to a second embodiment.

Next, a second embodiment of the present invention will be described with reference to FIG. 13. In the second embodiment, a slope member is used as a refractive-index medium. Note that in the second embodiment, the same constituent elements as those in the first embodiment are given the same reference numerals and descriptions thereof will be omitted.

An optical sensor 21 according to the second embodiment is configured substantially in the same manner as the optical sensor 1 according to the first embodiment. Accordingly, the light-emitting element 3 and the light-receiving element 4 are provided on the substrate 2, and the light-emitting element 3 and the light-receiving element 4 are sealed by the transparent resin members 5 and 7, respectively. Note that, however, a slope member 22 as a slope body being positioned above the light-emitting element 3 and having a slope surface 22A is formed in the transparent resin member 5. The slope member 22 is sloped so that its height dimension (thickness dimension) becomes smaller with a portion thereof on the light-receiving element 4 side being gradually lowered as it comes closer to the light-receiving element 4. As such, the slope 22A is sloped relative to the surface 2A (horizontal surface) of the substrate 2 so that its height position is gradually lowered as it comes closer to the light-receiving element 4. In other words, the slope surface 22A is sloped at a slope angle α relative to the surface 2A of the substrate 2.

With this, light emitted from the light-emitting element 3 is outputted via the slope member 22 in the opposite direction with respect to the light-receiving element 4. Like in the first embodiment, the stray light level is lowered because the light outputted from the slope member 22 as a refractive-index medium is slanted in the opposite direction with respect to the light-receiving element 4.

Figure 14:
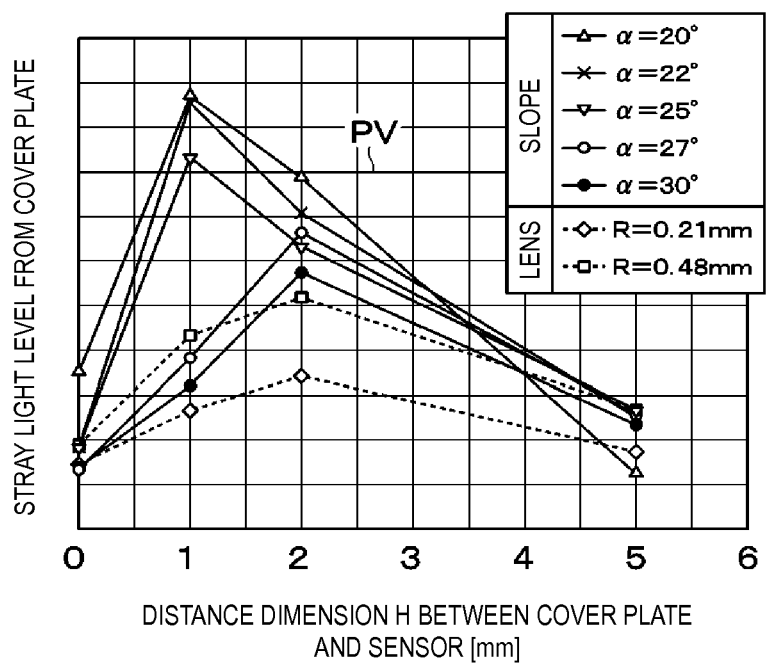
FIG. 14 is a characteristics diagram indicating a relationship between a stray light level from a cover plate and a distance dimension between the cover plate and a sensor, based on simulation.
Figure 15:
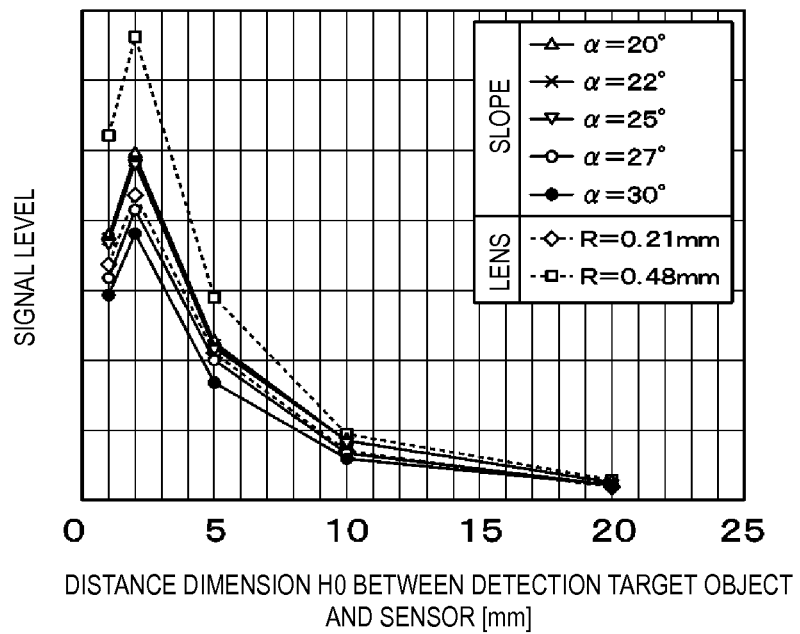
FIG. 15 is a characteristic diagram indicating a relationship between a signal level and a distance dimension between a detection target object and a sensor, based on simulation.

In order to confirm the above-discussed effect, simulations of the stray light level and the signal level were carried out in the case where the slope angle α of the slope member 22 was changed. The results thereof are shown in FIG. 14 and FIG. 15, respectively. For comparison, the results of the first embodiment in the cases where the lens radius R was 0.21 mm and 0.48 mm as shown in FIGS. 9 and 10 are also described in FIGS. 14 and 15, respectively.

As shown in FIG. 14, the slope angle α must be equal to or greater than 27 degrees so as to make the stray light level equal to or lower than a certain stray light level. Meanwhile, regarding the signal level, each one is substantially equal to the level when the lens radius R is 0.21 mm irrespective of the slope angle α, as shown in FIG. 15. Table 4 shows a relationship among the slope angle α, the beam divergence angle θ of light outputted from the slope member 22, and the elevation angle φ of the optical axis. Because the slope member 22 does not have a light focusing function due to the lens effect, the divergence angle thereof is wider, because of influence of the refractive index, than the beam divergence angle θ0 of the light-emitting element 3 itself (14 degrees as the full width at half maximum). With the slope angle α being in a range of 20 degrees to 30 degrees, the beam divergence angle θ as the full width at half maximum is 29 degrees to 42 degrees, and the elevation angle φ of the optical axis is 47 degrees to 57 degrees.

TABLE 4

| Slope Angle α of Slope Member [deg] | Divergence Angle [deg] | | Optical Axis Elevation Angle φ [deg] |
|---|---|---|---|
| | 1/e² Full Width | Full Width at Half Maximum | |
| 20 | 35.3 | 28.8 | 56.6 |
| 22 | 35.8 | 28.8 | 55.8 |
| 25 | 38.3 | 30.2 | 53.5 |
| 27 | 40.0 | 31.7 | 52.0 |
| 30 | 45.7 | 41.8 | 47.4 |

Figure 16:
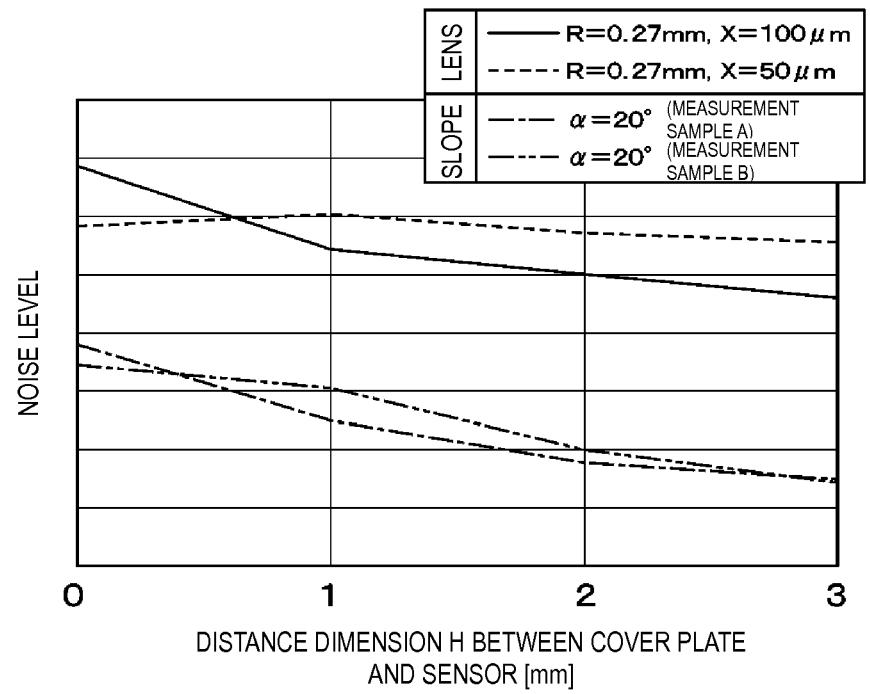
FIG. 16 is a characteristics diagram indicating a relationship between a noise level and a distance dimension between a cover plate and a sensor, based on measurement data.

FIG. 16 shows noise measurement data obtained when the slope member 22 was used. In FIG. 16, for comparison, data obtained in the case where the lens radius R was 0.27 mm and the shift amount X of the light-emitting element 3 was 50 μm and data obtained in the case where the lens radius R was also 0.27 mm and the shift amount X of the light-emitting element 3 was 100 μm are described, respectively. The case in which the slope member 22 was used as in the second embodiment exhibited a smaller noise level than the case in which the lens 6 was used as in the first embodiment. In this case, the slope angle α of the slope member 22 was 20 degrees. Note that in FIG. 16, two characteristics curves according to the second embodiment are shown as a measurement sample A and a measurement sample B, which means that two different measurement samples were used.

The simulation result in FIG. 14 shows that the case in which the lens 6 with the lens radius R being 0.21 mm is used and the case in which the lens 6 with the lens radius R being 0.48 mm is used both exhibit a smaller stray light level than the case in which the slope member 22 is used. Further, in the case where the slope angle α of the slope member 22 is equal to or less than 25 degrees, the stray light level increases. These magnitude correlations are reversed in the measurement result shown in FIG. 16, that is, the simulation and the measurement have different trends from each other.

Figure 17:
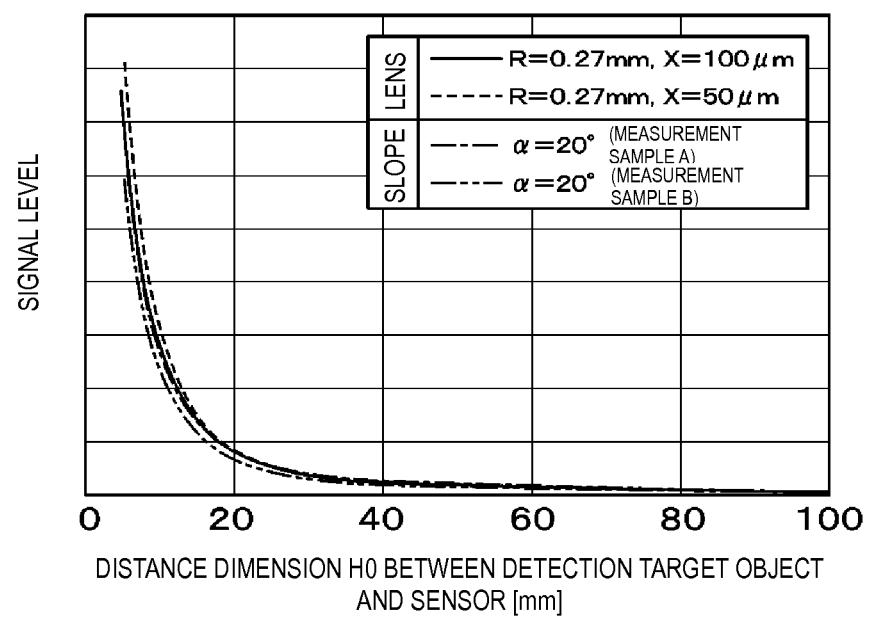
FIG. 17 is a characteristics diagram illustrating a relationship between a signal level and a distance dimension between a detection target object and a sensor, based on measurement data.

FIG. 17 shows measurement data of the signal level. For comparison, like in FIG. 16, data obtained in the case where the lens radius R was 0.27 mm and the shift amount X of the light-emitting element 3 was 50 μm and data obtained in the case where the lens radius R was also 0.27 mm and the shift amount X of the light-emitting element 3 was 100 μm are described in FIG. 17, respectively. As shown in FIG. 17, the slope member 22 gives a smaller signal level than the lens 6. This trend is substantially the same as that of the simulation result shown in FIG. 15.

There are cases where trends of the simulation and the measurement do not match each other regarding the noise (stray light) as well as regarding the signal level. The reason for this can be thought as follows: that is, influential parameters of actual matters are not taken into consideration (for example, internal scattering, surface scattering, and so on).

Although the cases in which trends of the simulation and the measurement do not match each other are observed, it has been confirmed that noise (stray light) can be suppressed also by using the slope member 22 as a refractive-index medium and the level thereof can be made equal to or lower than a set value by the position of the cover plate CP (glass plate). For example, in the case where the slope angle α is in a range of 20 degrees to 30 degrees, the stray light level can be lowered while the signal level being ensured by setting the optical axis of light outputted via the slope member 22 at the elevation angle φ in a range of 47 degrees to 57 degrees toward the opposite direction side with respect to the light-receiving element 4 and setting the beam divergence angle θ to be in a range of 29 degrees to 42 degrees.

Although the slope member 22 is integrally formed with the transparent resin member 5 sealing the light-emitting element 3, it may be formed being separated from the transparent resin member 5. Further, the configuration may be such that the transparent resin member 5 is omitted. The slope surface 22A may not be limited to a flat surface, and may be a curved surface.

Next, a third embodiment of the present invention will be described with reference to FIG. 18. In the third embodiment, two light-receiving elements corresponding to one light-emitting element are provided on a substrate. Note that in the third embodiment, the same constituent elements as those in the first embodiment are given the same reference numerals and descriptions thereof will be omitted.

In an optical sensor 31 according to the third embodiment, two light-receiving elements 32 and 33 are mounted on the substrate 2, and these two light-receiving elements 32 and 33 are sealed by, for example, a transparent resin member 34. Lenses respectively configured to focus light on the light-receiving elements 32 and 33 may be provided in the transparent resin member 34.

The two light-receiving elements 32 and 33 are disposed at positions that do not sandwich the light-emitting element 3. For example, the light-emitting element 3 is disposed on the right side in FIG. 18, while both the light-receiving elements 32 and 33 are disposed on the left side in FIG. 18.

Figure 18:
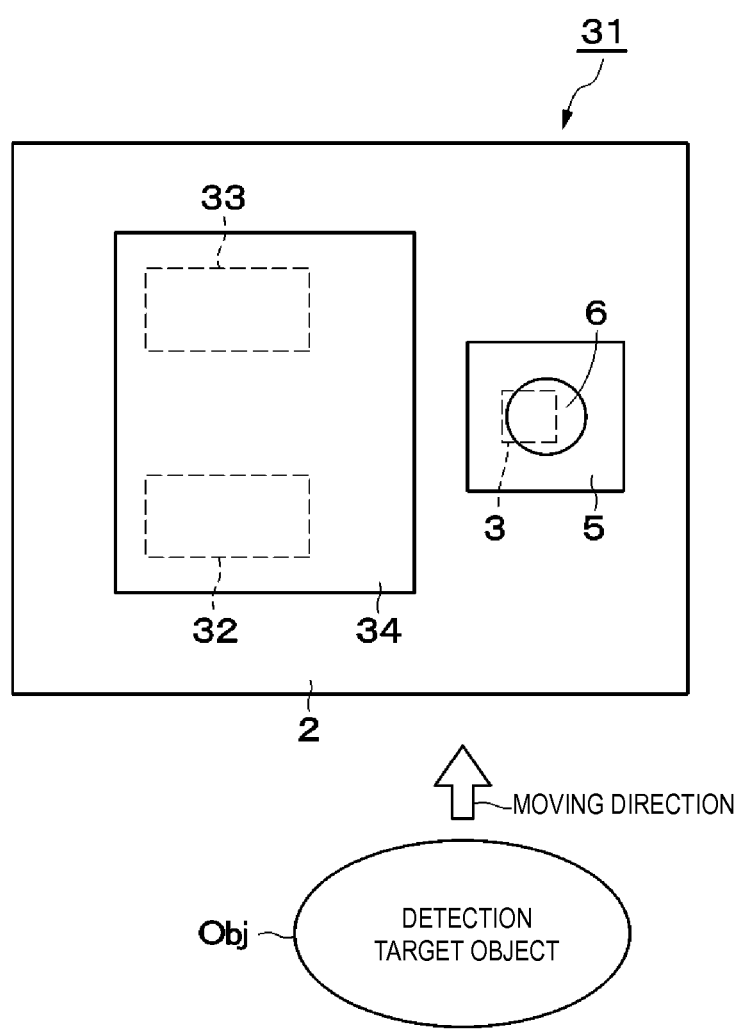
FIG. 18 is a plan view illustrating an optical sensor according to a third embodiment.

Meanwhile, the light-receiving element 32 and light-receiving element 33 are disposed at different positions in the upper-lower direction in FIG. 18. As such, when the detection target object Obj moving in the upper-lower direction in FIG. 18 passes over the optical sensor 31, light that is outputted from the light-emitting element 3 strikes the detection target object Obj, and reflected light therefrom is first received by the light-receiving element 32 and subsequently received by the light-receiving element 33. The moving direction of the detection target object Obj can be detected by performing signal processing on this time difference.

The light-emitting element 3 and the lens 6 are disposed at positions shifted from each other in the left-right direction in FIG. 18. As such, light emitted from the light-emitting element 3 is outputted via the lens 6 in a state of being slanted in the opposite direction with respect to the light-receiving elements 32 and 33. This makes it possible to reduce the stray light from the light-emitting element 3 and obtain a high S/N ratio.

As described thus far, the optical sensor 31 having both a function for proximity detection and a function for movement detection of the detection target object Obj, can be configured while exhibiting a high S/N ratio.

Although the third embodiment is described using an example in which the aspect of the invention is applied to the first embodiment, the aspect can be applied to the second embodiment as well. In addition, although the third embodiment is described using an example in which the two light-receiving elements 32 and 33 are provided in the sensor, the configuration may be such that three or more light-receiving elements are provided. Further, the light-emitting element 3 is not limited to being single, and two or more light-emitting elements may be provided.

The above-described embodiments are each configured such that light from the light-emitting element 3 is slanted toward an opposition direction side with respect to the light-receiving element 4, 32, or 33 by the lens 6 or the slope member 22 as a refractive-index medium. However, the present invention is not intended to be limited thereto, and a configuration in which light from a light-emitting element is directly slanted toward an opposition direction side with respect to a light-receiving element by mounting the light-emitting element in a slanted manner on a substrate may be employed, for example. In this case, the refractive-index medium need not refract the optical axis of light from the light-emitting element and it is sufficient for the refractive-index medium to cover the upper portion of the light-emitting element.

In the above-described embodiments, although the light-emitting element 3 and the light-receiving elements 4, 32, and 33 are individually sealed by the transparent resin member 5 and the transparent resin members 7 and 34, the light-emitting element and the light-receiving elements may be sealed by a transparent resin member integrally.

REFERENCE SIGNS LIST 1, 21, 31 optical sensor
2 substrate
2A surface
3 light-emitting element
4, 32, 33 light-receiving element
6 lens (refractive-index medium)
22 slope member (refractive-index medium)

The invention claimed is:

1. An optical sensor comprising:
a substrate;
a light-emitting element disposed on a surface of the substrate;
a light-receiving element disposed on the surface of the substrate and configured to detect a target object by receiving light emitted from the light-emitting element and reflected by the target object;
a lens disposed above the light-emitting element and having an optical axis, optical axis of the lens being offset from a center of the light-emitting element so that the optical axis of the light emitted from the light-emitting element and passing through the lens has an optical axis which tilts away from the optical axis of the lens in a direction moving away from the light-receiving element; and
a cover plate located above the light-emitting element, the light-receiving element and the lens such that at least some of the light emitted by the lens reflects off the cover plate; and
wherein the optical axis of the light passing through the lens has an elevation angle between 50 degrees and 89 degrees in a direction away from the light-receiving element and a beam divergence angle between 1.8 degrees and 20.3 degrees.

2. The optical sensor according to claim 1, wherein the lens has a radius and a mounting position of the light-emitting element is disposed on the surface of the substrate at a position shifted relative to the center of the lens that is closer to the light-receiving element in a range between 2% and 62% of the lens radius.

3. The optical sensor according to claim 1, wherein the lens comprises at least one of an aspherical lens and an asymmetric lens having different curvature in a front-rear direction and a left-right direction.

4. The optical sensor according to claim 1, wherein the lens comprises a radius between 0.21 mm and 0.48 mm.

5. The optical sensor according to claim 1, further including a transparent resin member located over the light-receiving element between the light-receiving element and the cover plate.

6. The optical sensor of claim 1 wherein the light-receiving element is a first light receiving element and the optical sensor further comprises a second light-receiving element disposed on the surface of the substrate and below the cover plate, the second light-receiving element being configured to detect the target object by receiving light passing through the lens and reflected by the target object, the light-emitting element being disposed at a position on the surface of the substrate that is not between the first and second light-receiving elements.

7. The optical sensor according to claim 6, wherein the optical axis of the light emitted by the lens has an elevation angle between 50 degrees and 89 degrees in a direction away from the first and second light-receiving elements and a beam divergence angle between 1.8 degrees and 20.3 degrees.

8. The optical sensor according to claim 7, wherein a mounting position of the light-emitting element is disposed on the surface of the substrate at a position shifted relative to a center of the lens that is closer to the plurality of light-receiving elements in a range between 2% and 62% of the lens radius.

9. The optical sensor according to claim 6, wherein the lens comprises at least one of an aspherical lens and an asymmetric lens having different curvature in a front-rear direction and a left-right direction.

10. An optical sensor comprising:
a substrate;
a light-emitting element disposed on a surface of the substrate;
a light-receiving element disposed on the surface of the substrate and configured to detect a target object by receiving light emitted from the light-emitting element and reflected by the target object;
a refractive-index medium disposed above the light-emitting element, the refractive index medium having a planar sloped outer surface which is located directly above the light-emitting element and through which the light emitted by the light-emitting element passes, the light passing through the sloped outer surface having an optical axis which extends away from the light-receiving element; and a cover plate located above the light-emitting element, the light-receiving element and the refractive index medium, the relative positions of the light-emitting element, the refractive index medium and the cove plate being such that at least some of the light emitted by the light-emitting element passes through the refractive-index medium and reflects off the cover plate.

11. The optical sensor according to claim 10, wherein a height of the sloped outer surface, relative to the substrate, decreases towards the light-receiving element.

12. The optical sensor according to claim 11, wherein the optical axis of the light passing through the sloped outer surface has an elevation angle between 47 degrees and 57 degrees in a direction away from the light-receiving element and a beam divergence between 29 degrees and 42 degrees.

13. The optical sensor according to claim 10, wherein the optical axis of the light passing through the sloped outer surface has an elevation angle between 47 degrees and 57 degrees in a direction away from the light-receiving element and a beam divergence between 29 degrees and 42 degrees.

14. The optical sensor according to claim 10, wherein the optical axis of the light output by the sloped outer surface has an elevation angle between 47 degrees and 57 degrees in a direction away from at least one of the plurality of light-receiving element and a beam divergence between 29 degrees and 42 degrees.

15. The optical sensor according to claim 10, further including a transparent resin member located over the light-receiving element between the light-receiving element and the cover plate.

* * * * *